United States Patent
Yu et al.

(10) Patent No.: US 9,049,785 B2
(45) Date of Patent: Jun. 2, 2015

(54) MOUNTING DEVICE FOR EXPANSION CARD

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Xiang Yu, Shenzhen (CN); Xiao-Yong Ma, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 137 days.

(21) Appl. No.: 13/747,634

(22) Filed: Jan. 23, 2013

(65) Prior Publication Data

US 2013/0285522 A1 Oct. 31, 2013

(30) Foreign Application Priority Data

Apr. 27, 2012 (CN) .......................... 2012 1 0127475

(51) Int. Cl.
*H05K 5/02* (2006.01)
*G06F 1/18* (2006.01)

(52) U.S. Cl.
CPC .............. *H05K 5/0282* (2013.01); *G06F 1/181* (2013.01); *G06F 1/186* (2013.01)

(58) Field of Classification Search
CPC ....................................................... H05K 5/02
USPC ........ 312/223.2; 361/801, 802, 726, 752, 796
See application file for complete search history.

(56) References Cited

U.S. PATENT DOCUMENTS

| | | | |
|---|---|---|---|
| 5,317,483 A * | 5/1994 | Swindler ........................ | 361/801 |
| 5,640,309 A * | 6/1997 | Carney et al. ................. | 361/801 |
| 6,320,752 B1 * | 11/2001 | Jang ................................ | 361/740 |
| 6,693,802 B2 * | 2/2004 | Vier et al. ...................... | 361/801 |
| 6,937,481 B1 * | 8/2005 | Newman et al. .............. | 361/801 |
| 6,950,313 B1 * | 9/2005 | Shih ............................... | 361/759 |
| 6,972,370 B2 * | 12/2005 | Wang et al. .................... | 174/535 |
| 7,110,251 B2 * | 9/2006 | Wu ............................ | 361/679.32 |
| 7,134,895 B1 * | 11/2006 | Choy et al. .................... | 439/326 |
| 7,182,618 B1 * | 2/2007 | Choy et al. .................... | 439/328 |
| 7,254,041 B2 * | 8/2007 | Chen et al. .................... | 361/801 |
| 7,408,789 B2 * | 8/2008 | Tao et al. ....................... | 361/801 |
| 7,522,423 B2 * | 4/2009 | Chen et al. .................... | 361/728 |
| 7,525,811 B2 * | 4/2009 | Xiao .............................. | 361/759 |
| 7,561,440 B2 * | 7/2009 | Dai ................................ | 361/801 |
| 7,717,727 B2 * | 5/2010 | Li .................................. | 439/328 |

(Continued)

*Primary Examiner* — Jinhee Lee
*Assistant Examiner* — Rashen E Morrison
(74) *Attorney, Agent, or Firm* — Novak Druce Connolly Bove + Quigg LLP

(57) ABSTRACT

A mounting device includes a chassis and a mounting member. The chassis includes a rear plate, a side plate connected to the rear plate, and a bracket located on the rear plate. The bracket includes a top wall and a mounting piece. The mounting member includes a pressing plate and a mounting plate. The mounting piece defines a mounting hole. The mounting member is located between the side plate and the mounting piece. A first end of the mounting plate is secured to the side plate. A second end of the mounting plate is engaged in the mounting hole. The pressing plate and the top wall are configured for sandwiching a mounting tab of an expansion card. The mounting plate is elastically deformable to press the pressing plate towards the top wall.

20 Claims, 4 Drawing Sheets

(56) References Cited

U.S. PATENT DOCUMENTS

| | | | |
|---|---|---|---|
| 7,723,844 B2 * | 5/2010 | Feng et al. | 257/718 |
| 7,753,458 B2 * | 7/2010 | Liang et al. | 312/223.2 |
| 7,856,757 B2 * | 12/2010 | Ozawa | 49/176 |
| 7,974,100 B2 * | 7/2011 | Chen et al. | 361/747 |
| 8,567,736 B2 * | 10/2013 | Chen | 248/310 |
| 2007/0030660 A1 * | 2/2007 | Peng et al. | 361/801 |
| 2012/0224340 A1 * | 9/2012 | Geng et al. | 361/759 |
| 2013/0285522 A1 * | 10/2013 | Yu et al. | 312/223.2 |

* cited by examiner

MOUNTING DEVICE FOR EXPANSION CARD

BACKGROUND

1. Technical Field

The present disclosure relates to mounting devices, and more particularly to a mounting device for an expansion card.

2. Description of Related Art

A computer system usually includes expansion cards, such as sound cards, video cards, and graphics cards, for enhancing capabilities of the computer system. The expansion cards are often fixed in the computer system with screws. However, the installation of screws to fix the expansion cards is laborious and time-consuming.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
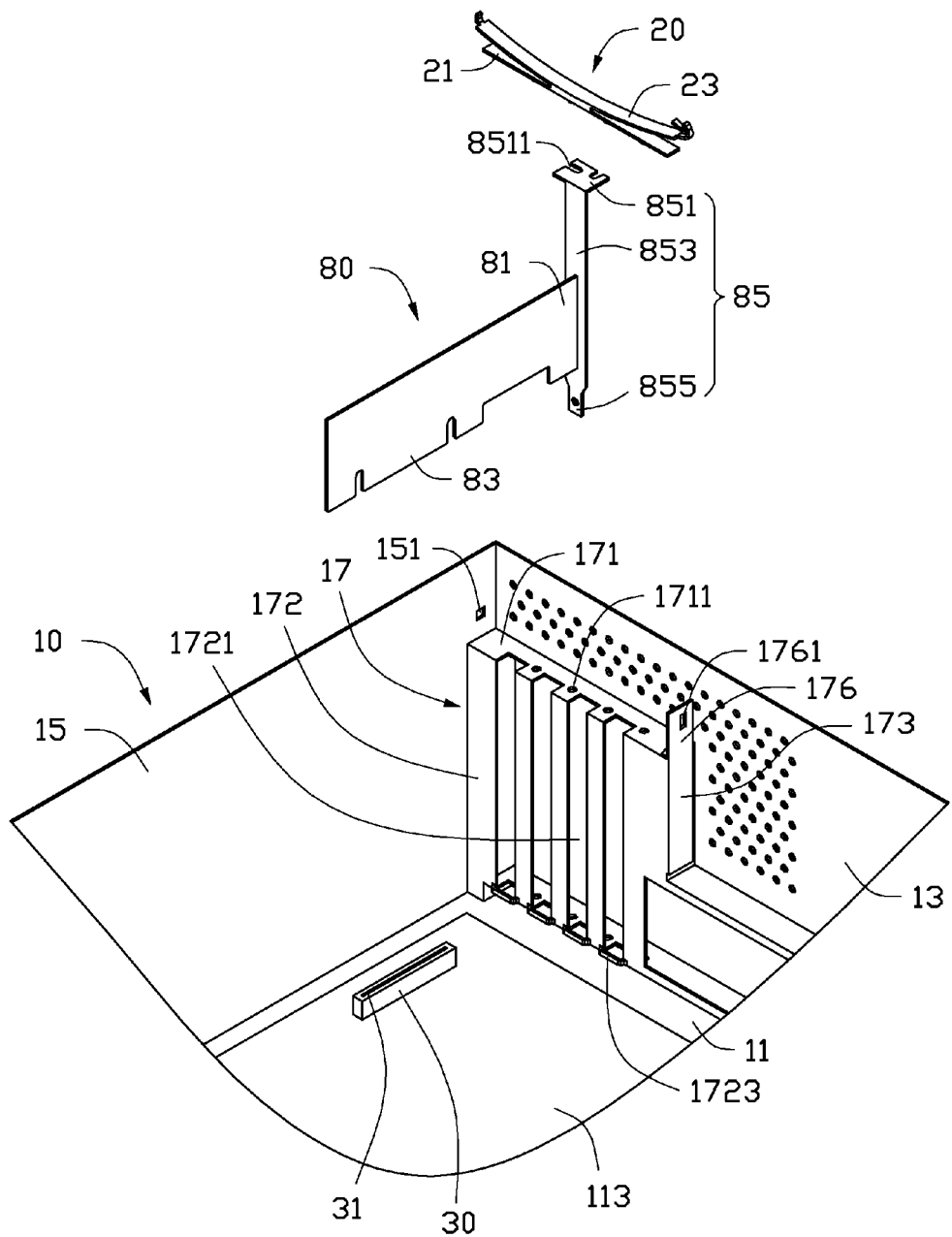
FIG. 1 is an exploded, isometric view of one embodiment of a mounting device and an expansion card.

FIG. 1 illustrates one embodiment of a mounting device for securing an expansion card 80. The mounting device includes a chassis 10 and a mounting member 20.

The expansion card 80 includes a first end 81 and a second end 83 opposite to the first end 81. A mounting tab 85 is secured in the first end 81. The mounting tab 85 includes a body 853, an installation portion 851, and an insert portion 855. The installation portion 851 is located on an end of the body 853. The insert portion 855 extends from the other end of the body 853. The installation portion 851 defines a cutout 8511. In one embodiment, the installation portion 851 is substantially perpendicular to the body 853 and the insert portion 855. The second end 83 can be coupled with a connector 30.

The chassis 10 includes a bottom plate 11, a rear plate 13, and a side plate 15. In one embodiment, the rear plate 13 is substantially perpendicular to the bottom plate 11 and the side plate 15, and the bottom plate 11 is substantially perpendicular to the side plate 15. A circuit board 113 is secured to the bottom plate 11. The connector 30 is secured to the circuit board 113 and defines a slot 31.

The rear plate 13 includes a bracket 17. The bracket 17 includes a top wall 171, a front wall 172, and a sidewall 173. In one embodiment, the top wall 171 is substantially perpendicular to the front wall 172 and the sidewall 173, the top wall 171 is substantially parallel to the bottom plate 11, and the sidewall 173 is substantially parallel to the side plate 15. The front wall 172 is connected between the side plate 15 and the sidewall 173. The top wall 171 defines a positioning hole 1711. The front wall 172 defines a plurality of installation slots 1721. Each installation slot 1721 extends to the top wall 171. A plurality of arched portions 1723 extends from the front wall 172. Each arched portion 1723 is under each installation slot 1721. A mounting piece 176 extends upwards from the sidewall 173. The mounting piece 176 defines a mounting hole 1761. In one embodiment, the mounting piece 176 is substantially parallel to the side plate 15. The side plate 15 defines a through hole 151 corresponding to the mounting hole 1761 of the mounting piece 176.

Figure 2:
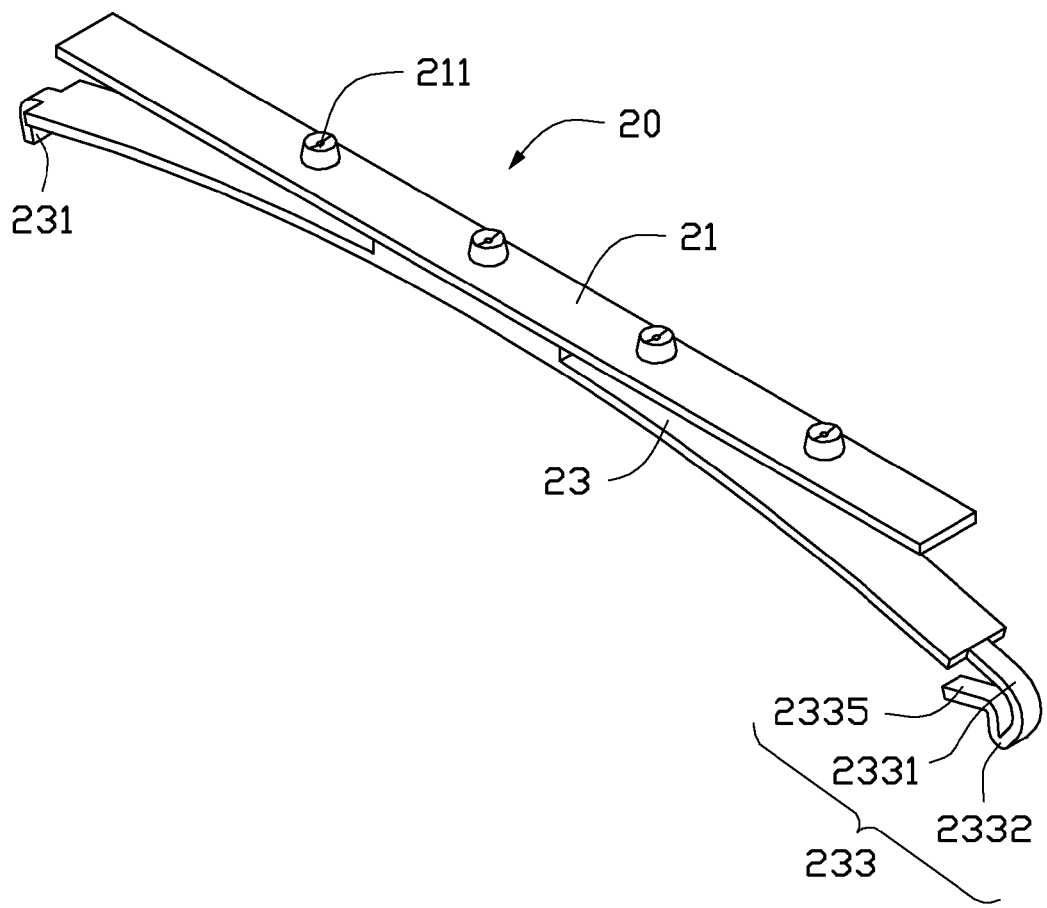
FIG. 2 is an isometric view of a mounting member of FIG. 1.
Figure 3:
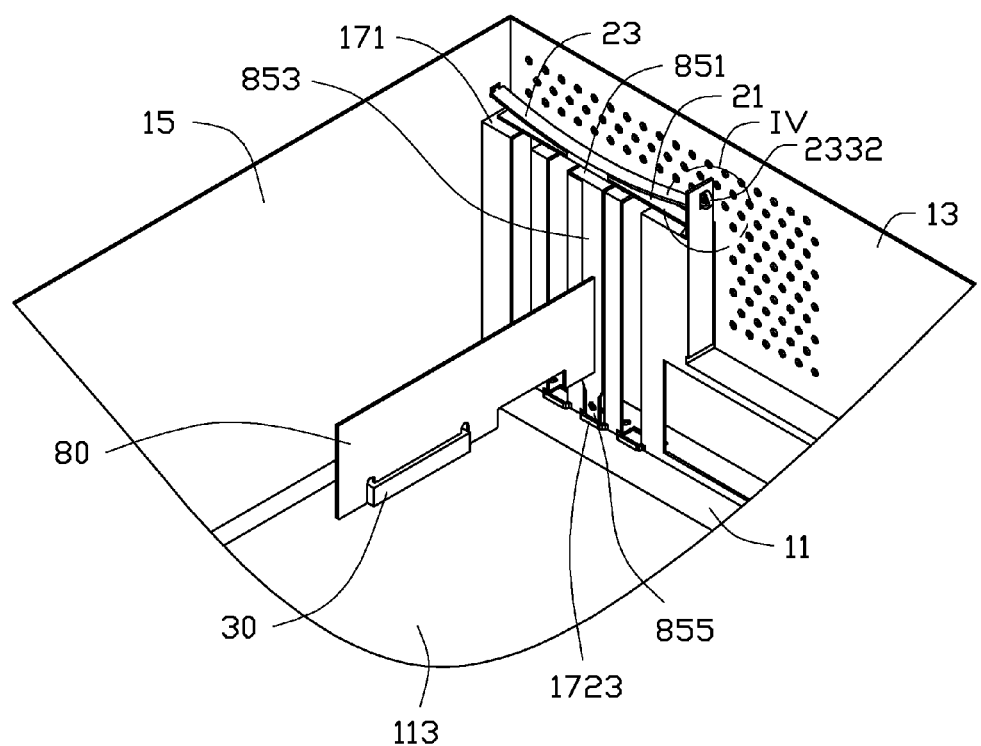
FIG. 3 is an assembled, isometric view of the mounting device and the expansion card of FIG. 1.
Figure 4:
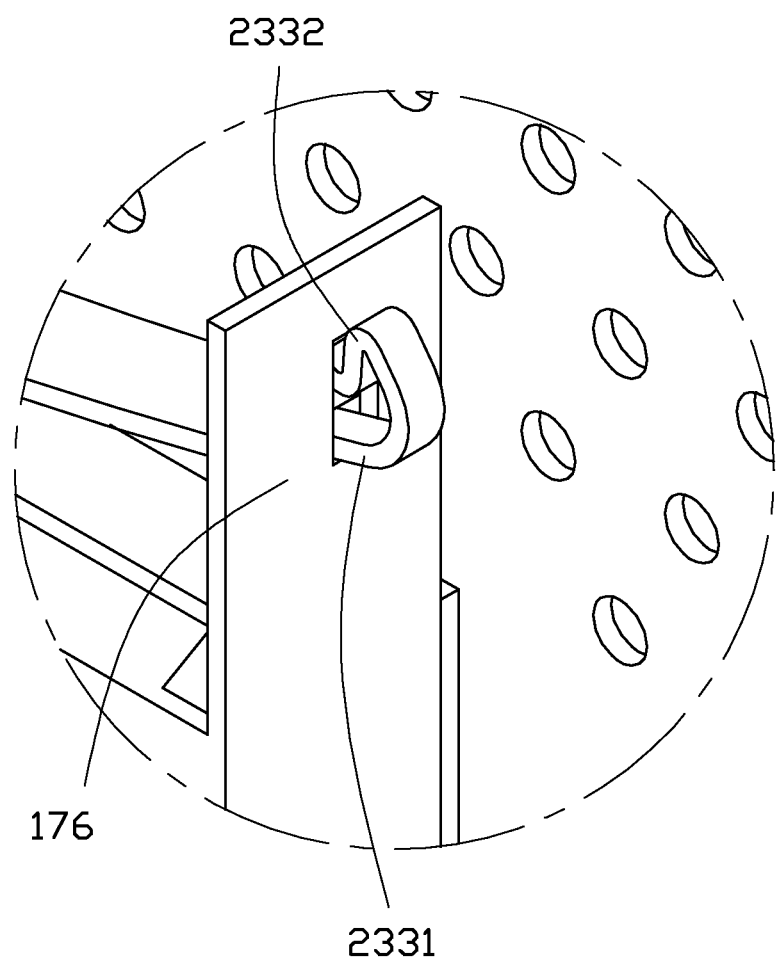
FIG. 4 is an enlarged view of a circled portion IV of the mounting device and the expansion card of FIG. 3.

FIG. 2 shows that the mounting member 20 includes a pressing plate 21 and a mounting plate 23 connected to the pressing plate 21. A plurality of protrusions 211 extend from a first side of the pressing plate 21. A middle portion of a second side of the pressing plate 21 is secured to the mounting plate 23. The mounting plate 23 is arched. A top end of the mounting plate 23 is secured to the middle portion of the second side of the pressing plate 21. Each of two opposite ends of the mounting plate 23 tilts away from the pressing plate 21. A positioning portion 231 extends from a first end of the two opposite ends of the mounting plate 23. The positioning portion 231 extends away from the pressing plate 21. A mounting portion 233 extends from a second end of the two opposite ends of the mounting plate 23. The mounting portion 233 includes a connecting piece 2331, a hook 2332, and a latching piece 2335. The connecting piece 2331 connects to the mounting plate 23. The hook 2332 extends from a bottom end of the connecting piece 2331. The latching piece 2335 extends obliquely from a bottom end of the hook 2332. An acute angle is defined between the latching piece 2335 and the connecting piece 2331. A minimum distance between the latching piece 2335 and the connecting piece 2331 is substantially equal to the size of the mounting hole 1761.

FIGS. 1-4 show that in assembly, the expansion card 80 is placed in the chassis 10, the insert portion 855 is aligned with the arched portion 1723, and the second end 83 is aligned with the slot 31. The expansion card 80 is moved towards the bottom plate 11, until the second end 83 is inserted in the slot 31 and the insert portion 851 is inserted in the arched portion 1723. In this position, the body 853 covers one installation slot 1721, the installation portion 851 abuts the top wall 171, and the cutout 8511 is aligned with the positioning hole 1711. The mounting member 20 is moved between the side plate 15 and the mounting piece 176. The mounting member 20 is obliquely placed to extend the positioning portion 231 out of the side plate 15 through the through hole 151. The mounting member 20 is rotated about the positioning portion 231. The mounting plate 23 is elastically deformed away from the pressing plate 21 by being pressed by the mounting piece 176. Until the hook 2332 is aligned with the mounting hole 1761, the pressing plate 21 abuts the top wall 171 and the installation portion 851, and each protrusion 211 is engaged in each cutout 8511 and each positioning hole 1711. The latching piece 2335 is pressed towards the connecting piece 2331, and the hook 2332 is elastically deformed and extends out of the mounting hole 1761. The latching piece 2335 and the hook 2332 rebound to secure the mounting portion 233 to the mounting piece 176. The mounting piece 176 is secured between the latching piece 2335 and the hook 2332. In this position, the mounting plate 23 rebounds towards the pressing plate 21 and exerts elastic force to secure the pressing plate 21 to the installation portion 851. Thus, the mounting member 20 secures the mounting tab 85 to the bracket 17.

In disassembly, the latching piece 2335 is pressed to be elastically deformed and elastically deforms the hook 2332. At the same time, the mounting plate 23 is moved away from the pressing plate 21. The hook 2332 is disengaged from the mounting hole 1761. The mounting member 20 is rotated about the positioning portion 231, and then the positioning portion 231 is disengaged from the through hole 151. The mounting member 20 is removed from the chassis 10, and the expansion card 80 is disengaged from the mounting member 20. The expansion card 80 can then be removed from the chassis 10.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A mounting device comprising:
   a chassis comprising a rear plate, a side plate connected to the rear plate, and a bracket located on the rear plate; and
   a mounting member comprising a pressing plate and a mounting plate;
   wherein the bracket comprises a top wall and a mounting piece; the mounting piece defines a mounting hole; the mounting member is located between the side plate and the mounting piece; a first end of the mounting plate is secured to the side plate, a second end of the mounting plate is engaged in the mounting hole, and the first end of the mounting plate is opposite to the second end of the mounting plate; the pressing plate and the top wall are configured for sandwiching a mounting tab of an expansion card; and the mounting plate is elastically deformed to press the pressing plate towards the top wall; and the mounting member further comprises a positioning portion extending from the first end of the mounting plate, the side plate defines a through hole, and the positioning portion extends out of the side plate through the through hole and is engaged with the side plate.

2. The mounting device of claim 1, wherein the side plate is substantially perpendicular to the rear plate, and the mounting piece is substantially parallel to the side plate.

3. The mounting device of claim 1, wherein the mounting plate is arched; and a top end of the mounting plate is secured to a middle of the pressing plate, and each of the first end and the second end of the mounting plate tilts away from the pressing plate.

4. The mounting device of claim 1, wherein the pressing plate is substantially parallel to the top wall.

5. The mounting device of claim 1, wherein the mounting member further comprises an elastically deformable mounting portion extending from the second end of the mounting plate; the elastically deformable mounting portion comprises a connecting piece, a hook connected to the connecting piece, and a latching piece extending from the hook; the connecting piece is connected to the mounting plate; and the hook and the latching piece are located on two opposite sides of the mounting piece.

6. The mounting device of claim 5, wherein the hook is elastically deformable to extend out of the mounting hole and engaged in the mounting hole; and the latching piece prevents the hook from disengaging from the mounting hole.

7. The mounting device of claim 6, wherein the latching piece is elastically deformable to disengage the hook from the mounting hole.

8. The mounting device of claim 5, wherein an acute angle is defined between the latching piece and the connecting piece.

9. The mounting device of claim 1, wherein the top wall defines a positioning hole, the mounting member further comprises a protrusion, and the protrusion is engaged in the positioning hole.

10. A mounting device comprising:
    a chassis comprising a rear plate, a side plate connected to the rear plate, and a bracket located on the rear plate, the bracket comprising a top wall and a mounting piece; and
    a mounting member comprising a pressing plate, a mounting plate, a positioning portion extending from a first end of the mounting plate, and an elastically deformable mounting portion extending from a second end of the mounting plate, a first end of the mounting plate being opposite to the second end of the mounting plate;
    wherein the mounting piece defines a mounting hole; the mounting piece is substantially parallel to the side plate and perpendicular to the pressing plate, and the mounting member is located between the side plate and the mounting piece; the positioning portion is secured to the side plate; the elastically deformable mounting portion is engaged in the mounting hole; the pressing plate and the top wall are configured for sandwiching a mounting tab of an expansion card; and the mounting plate is elastically deformable away from the pressing plate to press the pressing plate towards the top wall.

11. The mounting device of claim 10, wherein the side plate is substantially perpendicular to the rear plate.

12. The mounting device of claim 10, wherein the mounting plate is arched.

13. The mounting device of claim 12, wherein a top end of the mounting plate is secured to a middle of the pressing plate, and each of the first end and the second end of the mounting plate tilts away from the pressing plate.

14. The mounting device of claim 10, wherein the pressing plate is substantially parallel to the top wall.

15. The mounting device of claim 10, wherein the side plate defines a through hole, and the positioning portion extends out of the side plate through the through hole and is engaged with the side plate.

16. The mounting device of claim 10, wherein the elastically deformable mounting portion comprises a connecting piece, a hook connected to the connecting piece, and a latching piece extending from the hook; the connecting piece is connected to the mounting plate; the hook and the latching piece are located on two opposite sides of the mounting piece.

17. The mounting device of claim 16, wherein the hook is elastically deformable to extend out of the mounting hole and engaged in the mounting hole; the latching piece prevents the hook from disengaging from the mounting hole; and the latching piece is elastically deformable to disengage the hook from the mounting hole.

18. The mounting device of claim 16, wherein an acute angle is defined between the latching piece and the connecting piece.

19. The mounting device of claim 10, wherein the top wall defines a positioning hole, the mounting member further comprises a protrusion, and the protrusion is engaged in the positioning hole.

20. The mounting device of claim 2, wherein the mounting piece is substantially perpendicular to the pressing plate and the top wall, and the pressing plate and the mounting plate are located between the side plate and the mounting piece.

* * * * *